United States Patent
Matsudo et al.

(10) Patent No.: US 6,821,874 B2
(45) Date of Patent: Nov. 23, 2004

(54) METHOD FOR DEPOSITING TUNGSTEN SILICIDE FILM AND METHOD FOR PREPARING GATE ELECTRODE/WIRING

(75) Inventors: Masahiko Matsudo, Nirasaki (JP); Kenji Suzuki, Nirasaki (JP); Kazuya Okubo, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 167 days.

(21) Appl. No.: 09/757,583

(22) Filed: Jan. 11, 2001

(65) Prior Publication Data

US 2001/0008796 A1 Jul. 19, 2001

(30) Foreign Application Priority Data

Jan. 11, 2000 (JP) ........................................ 2000-002217

(51) Int. Cl.[7] .................. H01L 21/3205; H01L 21/4763
(52) U.S. Cl. ........................ 438/592; 438/595; 438/684; 257/407; 257/412; 257/413; 257/900
(58) Field of Search ................................ 438/195, 196, 438/399, 586, 587, 621, 706, 738, 584, 592, 595, 652, 683, 684; 257/382, 383, 407, 412, 413, 900

(56) References Cited

U.S. PATENT DOCUMENTS

| | | | | |
|---|---|---|---|---|
| 5,258,096 A | * | 11/1993 | Sandhu et al. | 438/621 |
| 6,001,718 A | * | 12/1999 | Katata et al. | 438/592 |
| 6,017,809 A | * | 1/2000 | Inumiya et al. | 438/585 |
| 6,227,720 B1 | * | 5/2001 | Isaksson | 385/75 |
| 6,251,188 B1 | * | 6/2001 | Hashimoto et al. | 438/586 |
| 6,277,720 B1 | * | 8/2001 | Doshi et al. | 438/586 |
| 6,333,274 B2 | * | 12/2001 | Akatsu et al. | 438/745 |
| 6,346,734 B2 | * | 2/2002 | Divakaruni et al. | 257/413 |
| 6,605,521 B2 | * | 8/2003 | Ajmera et al. | 438/595 |
| 6,686,059 B2 | * | 2/2004 | Shirahata | 428/629 |
| 2001/0023097 A1 | * | 9/2001 | Huang | 438/238 |
| 2003/0062566 A1 | * | 4/2003 | Schuegraf et al. | 257/316 |

FOREIGN PATENT DOCUMENTS

| | | |
|---|---|---|
| EP | 0 785 574 A2 | 7/1997 |
| JP | 10-247627 | 9/1998 |

OTHER PUBLICATIONS

U.S. Pub. 2003/0062566 Schuegraf et al. Apr. 3, 2003.*
U.S. patent appl. No. 09/385,848 filed Aug. 30, 1999.
U.S. patent appl. No. 09/023,712 filed Feb. 13, 1998.

* cited by examiner

*Primary Examiner*—W. David Coleman
*Assistant Examiner*—Khiem Nguyen
(74) *Attorney, Agent, or Firm*—Smith, Gambrell & Russell, LLP

(57) ABSTRACT

An electrode and/or wiring having a polycide structure is formed with voids V therein at the preparing stage as shown in FIG. 3. If the scale down and lowering of resistance of the electrode and/or wiring further proceed in future, the influence of the voids becomes obvious to lower yields.

According to the present invention, a method for depositing a tungsten silicide film is characterized in that when a tungsten silicide layer is formed on a polysilicon layer, a phosphorus atom containing gas is added to a reactive gas at least in the initial stage that the tungsten silicide layer is formed, and the amount of the added phosphorus atom containing gas is set to be in the range of from 0.2 vol. % to 0.45 vol. %.

20 Claims, 2 Drawing Sheets

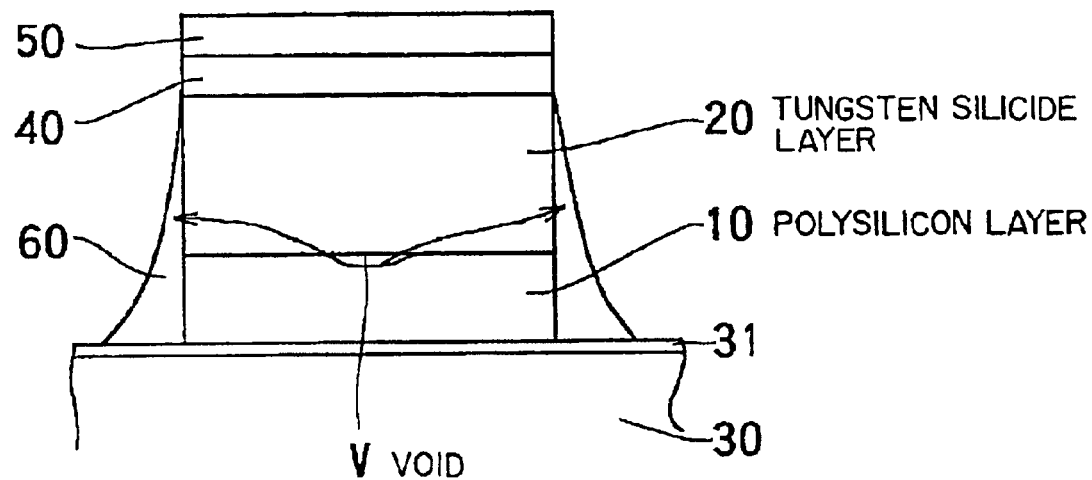
F I G. 3
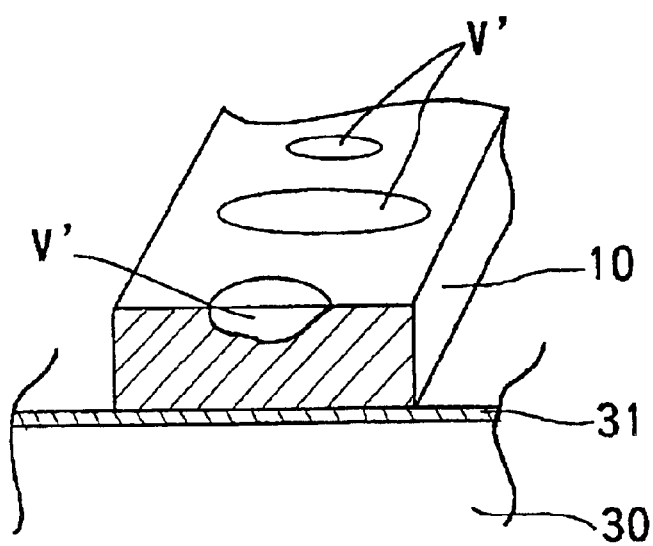
F I G. 4

METHOD FOR DEPOSITING TUNGSTEN SILICIDE FILM AND METHOD FOR PREPARING GATE ELECTRODE/WIRING

BACKGROUND OF THE INVENTION

1. Field of the Invention

The present invention relates generally to a semiconductor device. More specifically, the invention relates to a method for depositing a tungsten silicide film for use in a gate electrode/wiring (a gate electrode and/or a wiring), and a method for preparing a gate electrode/wiring.

2. Description of Related Background Art

In semiconductor devices, such as LSIs, a so-called polycide structure comprising a polysilicon layer 10 and a tungsten silicide layer 20 stacked thereon as shown in FIG. 3 is widely used as a gate electrode and/or a wiring in order to lower the resistance of the gate electrode and wiring. The tungsten silicide layer serving as a top layer of the polycide structure is generally deposited by the CVD method using $WF_6/SiCl_2H_2/Ar$ as a reactive gas. Therefore, in the conventional thin-film deposition method, a desired film quality of tungsten silicide layer is obtained by controlling the deposition temperature, the pressure of the reactive gas, and the flow rate and flow ratio of the gas. In FIG. 3, reference number 30 denotes a silicon substrate, 31 denotes a silicon oxide film, 40 denotes a silicon oxide film, 50 denotes a silicon nitride film, and 60 denotes a side wall of a silicon oxide film.

However, in the present circumstances, if an electrode and/or wiring having a polycide structure, which is scaled down as small as possible, is prepared by a conventional method for depositing a tungsten silicide film, there are some cases where a void V is formed in the electrode and/or wiring in the producing stage as shown in FIG. 3. Although the void has little influence on the productivity of semiconductor devices in the present stage, it is predicted that the influence of such a void becomes obvious to lower yields if the scale down and lowering of resistance of the electrode and/or wiring further proceed in future.

SUMMARY OF THE INVENTION

It is therefore an object of the present invention to eliminate the aforementioned problems and to provide a method for depositing a tungsten silicide film and a method for preparing a gate electrode/wiring, which can enhance yields in future without forming any voids in the electrode and/or wiring having a polycide structure. It is another object of the present invention to provide a gate electrode/wiring structure which is prepared by the gate electrode/wiring preparing method according to the present invention.

The inventors found that depressions V' corresponding to voids existed in the central portion of the surface of a polysilicon layer 10 when a tungsten silicide layer 20 was peeled off from the polysilicon layer 10 after a side wall oxidizing step of an electrode/wiring preparing process was completed in order to identify a void occurring step (see FIG. 4). On the basis of this, the inventors predicted that voids occur at the side wall oxidizing step by trying the identification of void existing places and existing step, and carried out the side wall oxidizing process while varying process temperature and process time. As a result, the inventors found that voids occurred at a high process temperature although no void occurred when the process time was short and/or when the process temperature was low.

From this fact, the inventors presumed that since more lattice defects and interstitial atoms concentrate on the interface between the polysilicon layer 10 and the tungsten silicide layer 20 than other portions, silicon atoms in the surface of the polysilicon layer 10 use lattice defects as media to diffuse to be consumed for the side wall oxidation to produce voids, as shown in FIG. 3 by an arrow, when the side wall oxidizing step is carried out at a high temperature. The side wall oxidizing step means a step of forming an oxide film on the side wall of the tungsten silicide layer 20 and on the side wall of the polysilicon layer 10 in order to prevent impurities from being injected into the tungsten silicide layer 20 and the polysilicon layer 10 from oblique directions when the impurities are ion-implanted.

Therefore, the inventors studied various tungsten silicide film depositing methods and gate electrode/wiring preparing methods which do not fear that silicon atoms are consumed even at the side wall oxidizing step. As a result, the inventors knew that the above described objects of the present invention can be accomplished by depositing a tungsten silicide film or preparing a gate electrode/wiring on specific conditions.

The present invention has been made on the basis of the above described knowledge. In order to accomplish the aforementioned and other objects, according to a first aspect of the present invention, there is provided a method for depositing a tungsten silicide film, wherein when a tungsten silicide layer is formed on a polysilicon layer, a phosphorus atom containing gas is added to a reactive gas at least in the initial stage that the tungsten silicide layer is formed, and the amount of the added phosphorus atom containing gas is set to be in the range of from 0.2 vol. % to 0.45 vol. %.

According to a second aspect of the present invention, there is provided a method for depositing a tungsten silicide film, wherein when a tungsten silicide layer is formed on a polysilicon layer, a phosphorus atom containing gas is added to a reactive gas at least in the initial stage that the tungsten silicide layer is formed, and a tungsten silicide layer forming temperature is set to be a temperature at which silicon atoms of the polysilicon layer are activated.

In the second aspect of the present invention, the tungsten silicide layer forming temperature is preferably set to be at least 700° C.

In the first and second aspects of the present invention, the method preferably includes a first stage in which the phosphorus atom containing gas is added to the reactive gas, and a second stage in which the phosphorus atom containing gas is not added to the reactive gas.

According to a third aspect of the present invention, there is provided a method for preparing a gate electrode/wiring, which comprises the steps of depositing a tungsten silicide layer on a polysilicon layer, and depositing a silicon layer on the tungsten silicide layer.

According to a fourth aspect of the present invention, there is provided a method for preparing a gate electrode/wiring, which comprises a step of depositing a tungsten silicide layer on a polysilicon layer, a step of oxidizing a side wall of a gate electrode/wiring layer containing the polysilicon layer and the tungsten silicide layer, and a short-time annealing step carried out between the depositing and oxidizing steps.

According to a fifth aspect of the present invention, there is provided a gate electrode/wiring structure which comprises a polysilicon layer, a tungsten silicide layer formed on the polysilicon layer, and a silicon layer formed on the tungsten silicide layer.

The tungsten silicide film depositing method (which will be hereinafter referred to as a "deposition method") according to the present invention is characterized in that a tungsten silicide layer is formed on a polysilicon layer, which has been previously formed by a conventional well-known method, by a method which will be described later. According to the present invention, the phosphorus atom containing gas is a gaseous molecule bonded to phosphorus atoms, and is preferably phosphine ($PH_3$). The reactive gas is a mixed gas composition comprising various gases required when tungsten silicide is produced, and is preferably a mixed gas of tungsten hexafluoride ($WF_6$), dichlorosilane ($SiCl_2H_2$) and argon (Ar). The composition ratio of the gases ($WF_6/SiCl_2H_2/Ar$) can be suitably set.

In the deposition method according to the present invention, a gas composition, which comprises a reactive gas and a phosphorus atom containing gas added to the reactive gas at least in the initial stage that a tungsten silicide layer is formed, is used when a tungsten silicide layer is formed on a polysilicon layer. By adding the phosphorus atom containing gas to the reactive gas, the growth nucleus of tungsten silicide can be formed in the surface of the polysilicon layer to grow a tungsten silicide crystal on the basis of the growth nucleus to suitably control the crystal grain and crystal orientation of the tungsten silicide film during the growth, so that it is possible to obtain a film quality having a small specific resistance and an excellent migration resistance. According to the present invention, phosphorus atoms are not only added, but the amount of the added phosphorus atom containing gas is also set to be in the range of from about 0.2 vol. % to about 0.45 vol. % so that it is possible to prevent silicon atoms of the polysilicon layer from diffusing. By setting the amount of the added phosphorus atom containing gas to be this range, lattice defects in the top face or vicinity of the polysilicon layer can be filled with phosphorus atoms to prevent or inhibit silicon atoms from diffusing from the polysilicon layer. If the amount of the added phosphorus atom containing gas is less than 0.2 vol. % of the reactive gas, it is not possible to obtain the effect that the phosphorus atom containing gas is added, and if the amount of the added phosphorus atom containing gas exceeds 0.45 vol. %, there is the possibility that the film quality deteriorates.

Therefore, since the phosphorus atom containing gas may be added at least in the initial stage that the tungsten silicide layer is formed, the phosphorus atom containing gas may or may not remain being added after the initial stage until the deposition step is completed. In either case, the deposition step is preferably divided into a first stage and a second stage. In the first stage, a predetermined amount of phosphorus atom containing gas is added, and in the second stage, a smaller amount of phosphorus atom containing gas than that in the first stage is added, or no phosphorus atom containing gas is added.

In the first stage, a first tungsten silicide film of a tungsten silicide layer containing relatively rich silicon is preferably formed. At this step, the reactive gas, to which the phosphorus atom containing gas has been added, is used as described above. By forming the growth nucleus of tungsten silicide using this gas, the crystal grain size and crystal orientation can be controlled. The tungsten silicide layer containing relatively rich silicon means a layer containing a high proportion of silicon atoms so that the ratio of atomic numbers (x/y) of tungsten silicide ($W_xSi_y$) is less than 2/5.

The second stage is carried out continuously after the first stage. At this step, a second tungsten silicide film of a tungsten silicide layer containing relatively rich tungsten is preferably formed. At this step, the tungsten silicide film can be deposited on the basis of the growth nucleus which has been formed in the first stage. Therefore, in the second stage, a tungsten silicide layer containing relatively rich tungsten, which has uniform crystal grain size and crystal orientation, can be formed only using the reactive gas without the need of the phosphorus atom containing gas. The tungsten silicide layer containing relatively rich tungsten means a layer containing a high proportion of tungsten atoms so that the ratio of atomic numbers (x/y) of tungsten silicide ($W_xSi_y$) exceeds 2/5. Since the second stage is carried out continuously from the first stage, there are some cases where phosphorus atoms contained in the reactive gas used in the first stage remain even if the reactive gas, to which no phosphorous atom containing gas has been added, is used in the second stage. For that reason, there are some cases where the remaining phosphorus atoms in the first stage is mixed in the reactive gas containing no phosphorus atom, which is used in the second stage, to form a tungsten silicide film containing a very small amount of phosphorus atom although phosphorous atoms are not added in the second stage. There are also some cases where even if the reactive gas containing no phosphorus atom is used in the second stage that the tungsten silicide film is deposited, phosphorus atoms diffuse from the first tungsten silicide film (lower layer) to the second tungsten silicide film (upper layer), so that the tungsten silicide film containing phosphorus atoms is formed.

When the reactive gas, to which the phosphorus atom containing gas has been added, is used even in the second stage, the proportion of the added phosphorus atom containing gas in the second stage is set to be lower than that in the first stage. Thus, the upper layer is made of a tungsten silicide film containing a lower concentration of phosphorus atoms than that of the lower layer. By thus setting the concentration of phosphorus in the second tungsten silicide film serving as the upper layer to be lower than the concentration of phosphorus in the first tungsten silicide film serving as the lower layer, phosphorus atoms diffuse from the lower layer to the upper layer during the heat treatment after the deposition, so that it is possible to lower the concentration of phosphorus in the lower layer. The phosphorus atoms in the lower layer diffuse into the upper layer after the heat treatment, so that it is possible to finally obtain a tungsten silicide film having a substantially uniform concentration of phosphorus in whole.

In the deposition method according to the present invention, the tungsten silicide film forming temperature (which will be hereinafter referred to as a "deposition temperature") is set to be a temperature at which silicon atoms of the polysilicon layer are activated. This temperature is preferably set to be at least 700° C. Since silicon atoms of the polysilicon layer and tungsten silicide layer are thus activated, lattice defects are filled with silicon atoms immediately even if the lattice defects are produced, so that no voids are produced.

For that reason, even if thermal energy is applied at the subsequent side wall oxidizing step, the diffusion of silicon atoms derived from lattice defects does not occur between the polysilicon layer and the tungsten silicide layer to decrease the absolute amount of silicon atoms consumed by the side wall oxidation, so that it is possible to prevent voids from being formed. Therefore, when the deposition temperature is set to be a high temperature of 700° C., the amount of phosphorus atoms is sufficient to be an amount capable of controlling the crystal grain size and crystal orientation of the tungsten silicide layer, e.g., in the range of from 0.02 vol. % to 0.2 vol. %.

The gate electrode/wiring preparing method according to the present invention includes a step of depositing a tungsten silicide layer on a polysilicon layer, and a step of depositing a silicon layer on the tungsten silicide layer. Although the former tungsten silicide film forming step can use a conventional well-known deposition method, the above described deposition method according to the present invention is preferably used in order to cope with the scale down and lowering of resistance of the electrode and/or wiring. The latter silicon film deposition step can use a conventional well-known deposition method. This silicon layer serves as a silicon atom supply source for a silicon oxide film which is formed at the side wall oxidizing step. Since the silicon atoms of the silicon layer are substituted for the silicon atoms of the polysilicon layer, the silicon atoms of the silicon layer are preferentially supplied for the silicon oxide film at the side wall oxidizing step even if lattice defects exist between the polysilicon layer and the tungsten silicide layer. By the silicon atoms of the silicon layer, the polysilicon atoms concerning the lattice defects of the polysilicon layer are inhibited or prevented from diffusing the surrounding, so that voids are inhibited or prevented from being formed between the polysilicon layer and the tungsten silicide layer.

Another gate electrode/wiring preparing method according to the present invention includes a step of forming a tungsten silicide layer on a polysilicon layer, a step of oxidizing a side wall of a gate electrode/wiring layer including the polysilicon layer and the tungsten silicide layer, and a short-time annealing step carried out between these steps. Although the former step of forming the tungsten silicide layer on the polysilicon layer can use a conventional well-known deposition method, the above described deposition method according to the present invention is preferably used. If the conventional well-known tungsten silicide film depositing method is used, lattice defects concentrate between the polysilicon layer and the tungsten silicide layer. Therefore, according to the present invention, the short-time annealing step is introduced between the deposition step and the side wall oxidizing step. By introducing the short-time annealing step after forming the tungsten silicide layer, the heat treatment activates the respective atoms of the polysilicon layer and tungsten silicide layer to diffuse the atoms into each other even if lattice defects concentrate on the interface between the polysilicon layer and the tungsten silicide layer, and particularly, the lattice defects existing in the interface are filled with silicon atoms to correct the lattice defects. By the short-time annealing, it is possible to obtain the same effects as those when a temperature (a high temperature of at least 700° C.), at which polysilicon atoms are activated, is set in the stage that the tungsten silicide layer is formed.

Therefore, even if the side wall oxidation is carried out after the short-time annealing, part of silicon atoms near the interface between the polysilicon layer and the tungsten silicide layer do not intensively diffuse into the surrounding, and the silicon atoms of the polysilicon layer near the interface diffuse uniformly on the whole surface to be supplied to the side wall oxide film, so that the thickness of the polysilicon layer can be decreased as a whole to prevent voids from being produced. The short-time annealing is carried out in, e.g., an inert gas atmosphere, such as nitrogen gas, by applying thermal energy from a heat source, such as a halogen lamp.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 3 is a sectional view schematically showing a wiring structure having voids which are formed by a side wall oxidation; and FIG. 4 is a perspective view schematically showing a state that a polysilicon layer remains in the wiring structure shown in FIG. 3.

DESCRIPTION OF THE PREFERRED EMBODIMENTS

Referring now to the accompanying drawings, particularly to FIG. 1, the preferred embodiment of the present invention will be described below.

Figure 1:
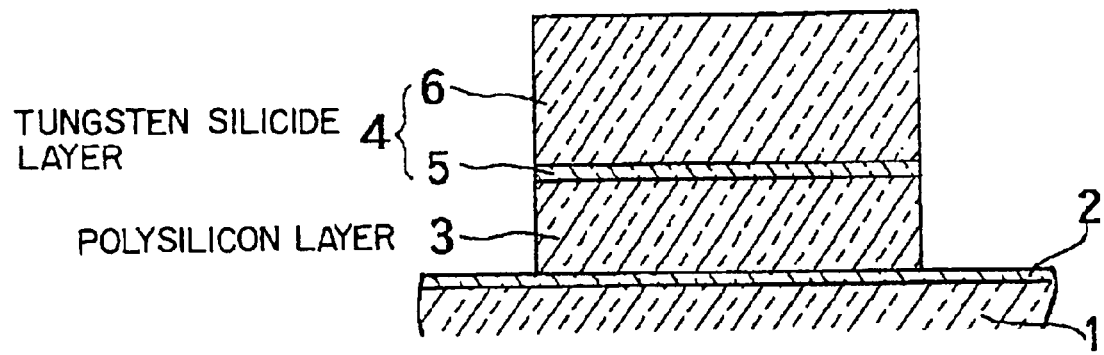
FIG. 1 is a sectional view schematically showing a principal part of a preferred embodiment of a semiconductor device according to the present invention.

FIG. 1 is an enlarged sectional view of a gate portion of the preferred embodiment of a semiconductor device using a tungsten silicide film according to the present invention. For example, as shown in this figure, a silicon oxide film 2 serving as a gate insulating film having a thickness of about 100 angstroms is formed on a silicon substrate 1, and a polysilicon layer 3 having a thickness of 1000 angstroms is formed on the silicon oxide film 2. Moreover, a tungsten silicide layer 4 is formed on the polysilicon layer 3. As shown in this figure, the tungsten silicide layer 4 is divided into a lower layer 5 and an upper layer 6. The lower layer 5 is a layer for providing a growth nucleus when the upper layer 6 is deposited, and made of tungsten silicide containing relatively rich silicon. The upper layer 6 is a main layer which substantially occupies the whole thickness of the tungsten silicide layer, and made of tungsten silicide containing relatively rich tungsten.

The lower layer 5 has a thickness of, e.g., about 150 angstroms, and the upper layer 6 has a thickness of, e.g., about 850 angstroms, so that the total thickness of both layers is about 1000 angstroms. The tungsten silicide layer 4 can be formed by conventional well-known CVD methods. However, this preferred embodiment is characterized in that the phosphorus atom containing gas, e.g., phosphine ($PH_3$), is added to the reactive gas ($WF_6/SiCl_2H_2/Ar$) to carry out the deposition at 700° C. This point is quite different from conventional processes.

On the basis of examples and reference and comparative examples, a deposition method according to the present invention will be described in detail below. Semiconductor wafers having a diameter of 8 inches were used as objects to be processed, and a deposition system having a chamber volume of about 18 liters was used. The tungsten silicide film 4 in this preferred embodiment was deposited on the polysilicon layer 3, which had been formed, on the following conditions.

EXAMPLE 1

At the first stage of the deposition step in this preferred embodiment, a reactive gas ($WF_6/SiCl_2H_2/Ar/PH_3$=1 sccm/ 300 sccm/20 sccm/60 sccm (the flow rate of $PH_3$ is expressed by one diluted to 1%, and this is the same in the subsequent preferred embodiments)) was supplied to a chamber, and a deposition process was carried out on the polysilicon layer 3 of a semiconductor wafer at a susceptor temperature of about 700° C. at a gas pressure of about 4.5 Torr in the chamber for about 52 seconds to obtain a lower layer 5 serving as a growth nucleus layer having a thickness of about 150 angstroms. In this case, the concentration of phosphine gas was about 0.16 vol. %.

Subsequently, an upper layer 6 was formed by a continuous deposition. At this second stage, a reactive gas containing no phosphine gas ($WF_6$/$SiCl_2H_2$/Ar=7.0 sccm/85 sccm/350 sccm) was supplied to the chamber, and a deposition process was carried out at a susceptor temperature of about 700° C. at a pressure of about 4.5 Torr in the chamber for about 31 seconds. Thereafter, dichlorosilane was supplied as a post flow for 30 seconds to obtain an upper layer 6 having a thickness of about 850 angstroms.

Then, a passivation film ($SiO_2$ film) was deposited on the surface of the tungsten silicide film 4 using TEOS by a conventional well-known technique. Then, after a resist was applied on the semiconductor wafer to be coated and developed, an electrode/wiring pattern was formed by etching, and the resist film was removed. Thereafter, the semiconductor wafer was processed in an atmosphere of 100% oxygen gas at 850° C. for 30 minutes to oxidize the side wall of the electrode/wiring.

EXAMPLE 2

In this example, a deposition process was carried out on the same conditions as those in Example 1, except that the amount of the added phosphine gas was double at the first stage of the deposition step and that the susceptor temperature in the chamber was set to be about 610° C. which was lower than 700° C. in Example 1. Thus, a lower layer 5 having a thickness of about 150 angstroms and an upper layer 6 having a thickness of about 850 angstroms were obtained. Then, after an electrode/wiring was formed on the same conditions as those in Example 1, a side wall oxidation was carried out.

Reference Example 1

In this reference example 1, a deposition process was carried out on the same conditions as those in Example 1, except that the susceptor temperature in the chamber was set to be 610° C. Thus, a lower layer 5 having a thickness of about 150 angstroms and an upper layer 6 having a thickness of about 850 angstroms were obtained. Then, after an electrode/wiring was formed on the same conditions as those in Example 1, a side wall oxidation was carried out.

Comparative Example 1

In this comparative example 1, a deposition process was carried out on the same conditions as those in Example 1, except that phosphine gas was not added to the reactive gas. Thus, a lower layer 5 having a thickness of about 150 angstroms and an upper layer 6 having a thickness of about 850 angstroms were obtained. Then, after an electrode/wiring was formed on the same conditions as those in Example 1, a side wall oxidation was carried out.

With respect to each of samples in Examples 1 and 2, Reference Example 1 and Comparative Example 1 after the side wall oxidation, the presence of voids was examined. In order to examine the presence of voids, each of the samples was wet-etched or dry-etched to remove the $SiO_2$ film, and then, an APM solution (hyper-aqueous ammonia (mixture of ammonia and hydrogen peroxide)) was used for carrying out a wet etching to remove the tungsten silicide layer 4. With respect to each of the samples, from which the tungsten silicide layer 4 had been removed, the surface and cross-section of the wiring pattern were observed by means of SEM. As a result, in both of Examples 1 and 2, the surface of the polysilicon layer 3 was flat, and any depressions shown in FIG. 4 were not observed. However, in Comparative Example 1, a depression was observed in the central portion of the surface of the polysilicon layer 3.

In Reference Example 1, although a depression was observed in the central portion of the surface of the polysilicon layer 3, the depression was smaller than that in Comparative Example 1. From this, it was revealed that if phosphorus atoms were added at the stage that the tungsten silicide layer 4 was formed, phosphorus atoms exist in the interface between the polysilicon layer and the tungsten silicide layer 4 as interstitial atoms to inhibit silicon atoms from diffusing from the polysilicon layer. It was also revealed that in view of the results in Example 2, if the amount of the added phosphine (phosphorus atoms) increases, more lattice defects in the interface between the polysilicon layer and the tungsten silicide layer were filled with phosphorus atoms, so that it was possible to surely prevent the diffusion of silicon atoms.

EXAMPLE 3

In this example, after a deposition process was carried out on the same conditions as those in Reference Example 1 to obtain a lower layer 5 having a thickness of about 150 angstroms and an upper layer 6 having a thickness of about 850 angstroms, and before a side wall oxidation was carried out, specifically, immediately after a tungsten silicide film was deposited, or immediately before a side wall oxidation was carried out, an annealing process was carried out for a short time of 30 seconds at 1000° C. in an atmosphere of 100% nitrogen. Then, after the side wall oxidation was carried out, the same process as that in Example 1 was carried out to remove the tungsten silicide layer, and then, the surface and cross-section of the wiring pattern were observed using SEM. As a result, the surface of the polysilicon layer 3 was flat, and no depression was observed. From this, it was revealed that the short-time annealing caused the mutual diffusion between silicon atoms and tungsten atoms in the interface between the polysilicon layer and the tungsten silicide layer and corrected lattice defects, which is similar to the case where the tungsten silicide layer forming temperature was set to be a temperature at which silicon atoms were activated, so that it was possible to prevent silicon atoms from diffusing from the polysilicon layer.

EXAMPLE 4

Figure 2:
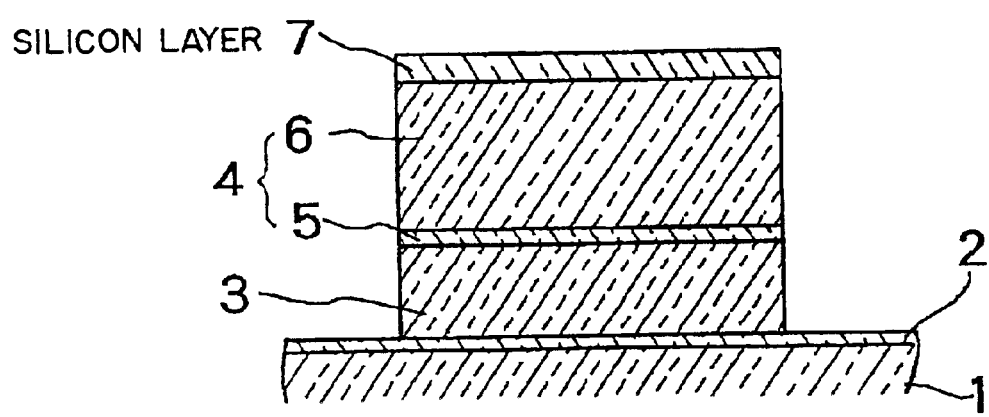
FIG. 2 is a sectional view schematically showing a principal part of another preferred embodiment of a semiconductor device according to the present invention.

In this example, a polysilicon layer 3 and a tungsten silicide layer 4 were formed as shown in FIG. 2 by the same procedure as that in Reference Example 1, and a silicon layer 7 having a thickness of about 50 to 200 angstroms was formed on the tungsten silicide layer 4 by a conventional well-known method. Thereafter, a passivation layer (not shown) was formed using, e.g., TEOS. Then, after an electrode/wiring was formed on the same conditions as those in Example 1, a side wall oxidation was carried out. Thereafter, an etching process was carried out by the same technique as that in Example 1 to remove layers up to the tungsten layer 4. Then, after the surface of the polysilicon layer 3 was observed by SEM, no depression was observed in the surface of the polysilicon layer 3. From this, it was revealed that the silicon layer on the tungsten silicide layer served as silicon atom supply source during the side wall oxidation.

While the tungsten silicide film has been applied to the semiconductor device in the above described preferred embodiments, a tungsten silicide film according to the present invention may be applied to an electrode/wiring structure, such as an LCD device.

As described above, according to the present invention, it is possible to provide a method for depositing a tungsten silicide film and a method for preparing a conductive film including a tungsten silicide film, which can enhance yields without forming any voids in an electrode and/or wiring having a polycide structure.

It is also possible to provide a gate electrode/wiring structure capable of enhancing yields without forming any voids in an electrode and/or wiring having a polycide structure.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for depositing a tungsten silicide film, wherein when a tungsten silicide layer is formed on a polysilicon layer, a phosphorus atom containing gas is added to a reactive gas at least in the initial stage that said tungsten silicide layer is formed and the amount of the added phosphorus atom containing gas is set to be in the range from 0.2 vol. % 0.45 vol. %.

2. A method for depositing a tungsten silicide film, wherein a tungsten silicide layer is formed on a polysilicon layer, a phosphorus atom containing gas is added to reactive gas at least in the initial stage that said tungsten silicide layer is formed, and a tungsten silicide layer forming temperature is set to be a temperature at which silicon atoms of said polysilicon layer are activated.

3. A method for depositing a tungsten silicide film as set forth in claim 2, wherein said tungsten silicide layer forming temperature is set to be least 700° C.

4. A method for depositing a tungsten silicide film as set forth in claim 1 or 2, which includes a first stage in which said phosphorus atom containing gas is added to said reactive gas, and a second stage in which said phosphorus atom containing gas is not added to said reactive gas.

5. A method for depositing a tungsten silicide film as set forth in claim 1 or 2, wherein said reactive gas is mixed gas of tungsten hexafluoride ($WF_6$), dichlorosilane ($SiCl_2H_2$) and argon (Ar).

6. A method for depositing a tungsten silicide film as set forth in claim 1, wherein a growth nucleus of tungsten silicide is formed on the surface of said polysilicon layer.

7. A method for depositing a tungsten silicide film as set forth in claim 2, wherein lattice defects, which may be produced, are filled with silicon atoms of said polysilicon layer or said tungsten silicide layer.

8. A method for preparing a gate electrode/wiring, which comprises:
a step of depositing a tungsten silicide layer on a polysilicon layer,
a step of depositing a silicon layer on said tungsten silicide layer; and
a side wall oxidizing step of forming a silicon oxide film on a side wall of a gate electrode/wiring layer including said polysilicon layer and said tungsten silicide layer,
wherein said silicon layer serves as a source for supplying silicon atoms to said silicon oxide film at said side wall oxidizing step.

9. A method for preparing a gate electrode/wiring, which comprises:
a step of depositing a tungsten silicide layer on a polysilicon layer,
a step of depositing a silicon layer on said tungsten silicide layer; and
a side wall oxidizing step of forming a silicon oxide film on a side wall of a gate electrode/wiring layer including said polysilicon layer and said tungsten silicide layer,
wherein at said step of depositing the tungsten silicide layer on the polysilicon layer, a phosphorus atom containing gas is added to a reactive gas at least in the initial stage that said tungsten silicide layer is formed, and the amount of the added phosphorus atom containing gas is set to be in the range of 0.2 vol.% to 0.45 vol. %.

10. A method for preparing a gate electrode/wiring, which comprises:
a step of depositing a tungsten silicide layer on a polysilicon layer,
a step of depositing a silicon layer on said tungsten silicide layer; and
a side wall oxidizing step of forming a silicon oxide film on a side wall of a gate electrode/wiring layer including said polysilicon layer and said tungsten silicide layer,
wherein at said step of depositing the tungsten silicide layer on the polysilicon layer, a phosphorus atom containing gas is added to a reactive gas at least in the initial stage that said tungsten silicide layer is formed, and a tungsten silicide layer forming temperature is set to be a temperature at which silicon atoms of said polysilicon layer are activated.

11. A method for preparing a gate electrode/wiring, which comprises:
a step of depositing a tungsten silicide layer on a polysilicon layer;
a side wall oxidizing step of oxidizing a side wall of a gate electrode/wiring layer containing said polysilicon layer and said tungsten silicide layer; and
a short-time annealing step carried out between said depositing and oxidizing steps.

12. A method for preparing a gate electrode/wiring as set forth in claim 11, wherein at said step of depositing the tungsten silicide layer on the polysilicon layer, a phosphorus atom containing gas is added to a reactive gas at least in the initial stage that said tungsten silicide layer is formed, and the amount of the added phosphorus atom containing gas is set to be in the range of 0.2 vol. % to 0.45 vol. %.

13. A method for preparing a gate electrode/wiring as set forth in claim 11, wherein in at said step of depositing the tungsten silicide layer on the polysilicon layer, a phosphorus atom containing gas is added to a reactive gas at lest in the initial stage that said tungsten silicide layer is formed, and a tungsten silicide layer forming temperature is set to be a temperature at which silicon atoms of said polysilicon layer are activated.

14. A method for preparing a gate electrode/wiring as set forth in claim 11, the short-time annealing step is an annealing step for preventing silicon atoms from diffusing from the polysilicon layer.

15. A method for preparing a gate electrode/wiring as set forth in claim 11, wherein the step of depositing a tungsten silicide layer on the polysilicon layer comprises a first step of depositing a first tungsten silicide layer including a phosphorus atom on the polysilicon layer and a second step of depositing a second tungsten silicide layer on the first tungsten silicide layer.

16. A method for preparing a gate electrode/wiring as set forth in claim 11, wherein the short time annealing step is carried out for 30 seconds at 1000° C. in an atmosphere of 100% nitrogen.

17. A method for preparing a gate electrode/wiring as set forth in claim 11,
wherein the step of depositing a tungsten silicide layer is a step of depositing a tungsten silicide layer including a phosphorus atom on the polysilicon layer.

18. A gate electrode/wiring structure comprising:
a polysilicon layer;
a tungsten silicide layer formed on said polysilicon layer; and
a silicon layer formed on said tungsten silicide layer;
wherein the silicon layer acts as a source for providing silicon with a side wall in the side wall oxidizing step of forming a silicon oxide film on the side wall.

19. A gate electrode/wiring structure comprising:
a polysilicon layer;
a tungsten silicide layer formed on said polysilicon layer; and
a silicon layer formed on said tungsten silicide layer;
wherein the tungsten silicide layer comprises a first tungsten silicide layer including a phosphorus atom and a second tungsten silicide layer formed on the first tungsten silicide layer.

20. A method for preparing a gate electrode/wiring, which comprises:
a step of depositing a tungsten silicide layer on a polysilicon layer,
a step of depositing a silicon layer on said tungsten silicide layer; and
a side wall oxidizing step of forming a silicon oxide film on a side wall of a gate electrode/wiring layer including said polysilicon layer and said tungsten silicide layer,
wherein the step of depositing a tungsten silicide layer is a step of depositing a tungsten silicide layer including a phosphorus atom on the polysilicon layer.

* * * * *